US008692365B2

(12) United States Patent
Moon et al.

(10) Patent No.: US 8,692,365 B2
(45) Date of Patent: Apr. 8, 2014

(54) INTEGRATED CIRCUIT PACKAGING SYSTEM WITH THERMAL DISPERSAL STRUCTURES AND METHOD OF MANUFACTURE THEREOF

(75) Inventors: DongSoo Moon, Ichon-si (KR); Taewoo Lee, Yongin-si (KR); Soo-San Park, Seoul (KR); SooMoon Park, Jinju-si (KR); Sang-Ho Lee, Yeoju (KR)

(73) Assignee: Stats Chippac Ltd., Singapore (SG)

( * ) Notice: Subject to any disclaimer, the term of this patent is extended or adjusted under 35 U.S.C. 154(b) by 359 days.

(21) Appl. No.: 13/163,611

(22) Filed: Jun. 17, 2011

(65) Prior Publication Data
US 2012/0319267 A1 Dec. 20, 2012

(51) Int. Cl.
*H01L 23/02* (2006.01)
(52) U.S. Cl.
USPC 257/686; 257/713; 257/E23.08; 257/E21.502; 438/122
(58) Field of Classification Search
CPC .............. H01L 24/01; H01L 2023/405; H01L 2224/28105

USPC ........................................... 257/686; 438/122
See application file for complete search history.

(56) References Cited

U.S. PATENT DOCUMENTS

| 7,034,388 | B2 | 4/2006 | Yang et al. |
| 7,169,642 | B2 | 1/2007 | Karnezos |
| 2004/0145039 | A1* | 7/2004 | Shim et al. ..................... 257/678 |
| 2005/0127489 | A1* | 6/2005 | Mallik et al. ................... 257/686 |

\* cited by examiner

*Primary Examiner* — Eva Yan Montalvo
(74) *Attorney, Agent, or Firm* — Ishimaru & Associates LLP

(57) ABSTRACT

A method of manufacture of an integrated circuit packaging system includes: providing a base substrate; attaching a package stack assembly, having a contact pad, on the base substrate; applying an encapsulation having a cavity with a tapered side directly over the package stack assembly, the contact pad exposed in the cavity; attaching a recessed circuitry unit in the cavity and on the contact pad, a chamber of the cavity formed by the recessed circuitry unit and the tapered side of the cavity; and mounting a thermal structure over the recessed circuitry unit, the cavity, and the encapsulation.

10 Claims, 4 Drawing Sheets

INTEGRATED CIRCUIT PACKAGING SYSTEM WITH THERMAL DISPERSAL STRUCTURES AND METHOD OF MANUFACTURE THEREOF

TECHNICAL FIELD

The present invention relates generally to an integrated circuit packaging system, and more particularly to a system with thermal dispersal structures.

BACKGROUND ART

Electronic products such as cell phone base products, global positioning systems (GPS), satellites, communication equipment, consumer products, and a vast line of other similar products are in ever increasing global demand. It is very important for products to continue to improve in features, performance, and reliability while reducing product costs, product size, and to be available quickly for purchase by the consumers or buyers.

Products must be capable of competing in world markets and attracting many consumers or buyers. Market growth for high density and high output/input integrated circuit packages has resulted in a trend for electronic products that are lightweight, smaller, multi-functional, and capable of ever increasing higher speeds.

Expectations for smaller packages continue to grow at an exponential rate. The expectations include the smaller packages with having smaller, faster, and increased reliable circuitry in packages with more and more connectors and with increasingly amounts of electrical connections to and from those smaller packages.

Thus, an increasing need remains to increase the electrical connections and reliability of packages as the sizes of the packages continue to shrink in size while the circuits inside those packages continue to increase. It is also critical that a balanced package solution that includes all aspects of performance, size, connectivity, costs, and reliability be found. The smaller packages must be able to connect to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate; attaching a package stack assembly, having a contact pad, on the base substrate; applying an encapsulation having a cavity with a tapered side directly over the package stack assembly, the contact pad exposed in the cavity; attaching a recessed circuitry unit in the cavity and on the contact pad, a chamber of the cavity formed by the recessed circuitry unit and the tapered side of the cavity; and mounting a thermal structure over the recessed circuitry unit, the cavity, and the encapsulation.

The present invention provides an integrated circuit packaging system, including: a base substrate; a package stack assembly having a contact pad attached on a side of the base substrate; an encapsulation having a cavity with a tapered side applied directly over the package stack assembly, the contact pad exposed in the cavity; a recessed circuitry unit in the cavity and on the contact pad, a chamber of the cavity formed by the recessed circuitry unit and the tapered side of the cavity; and a thermal structure over the recessed circuitry unit, the cavity, and the encapsulation.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
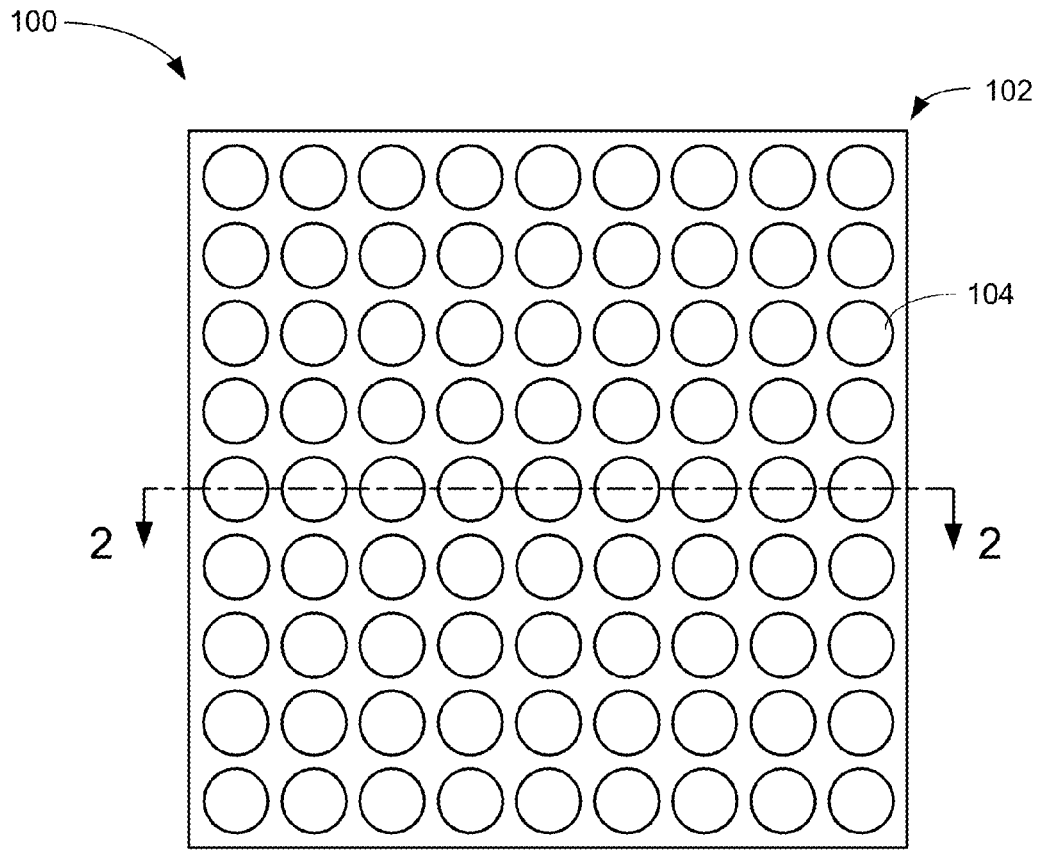
FIG. 1 is a bottom view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a bottom view of an integrated circuit packaging system 100 in a first embodiment of the present invention. Shown is a side of a base substrate 102 having package connectors 104 attached to the base substrate 102. The base substrate 102, such as a substrate, an interposer, a circuit board, or a laminate, includes conductive material to provide electrical connectivity within and between sides of the base substrate 102.

The package connectors 104 are defined as solder balls, conductive pins, leads, or conductive connectors used to provide connectivity between the integrated circuit packaging system 100 and a next level of integration (not shown) such as a printed circuit board or a component with integrated circuitry. The package connectors 104 can be formed from an electrically conductive material that can include solder, aluminum, copper, or a mixed alloyed combination thereof.

The package connectors 104 can be of different shapes or distributed on the base substrate 102 differently. For example, the package connectors 104 can be oval shaped or distributed having an offset from a center of the side of the base substrate 102 towards the periphery of the base substrate 102.

Figure 2:
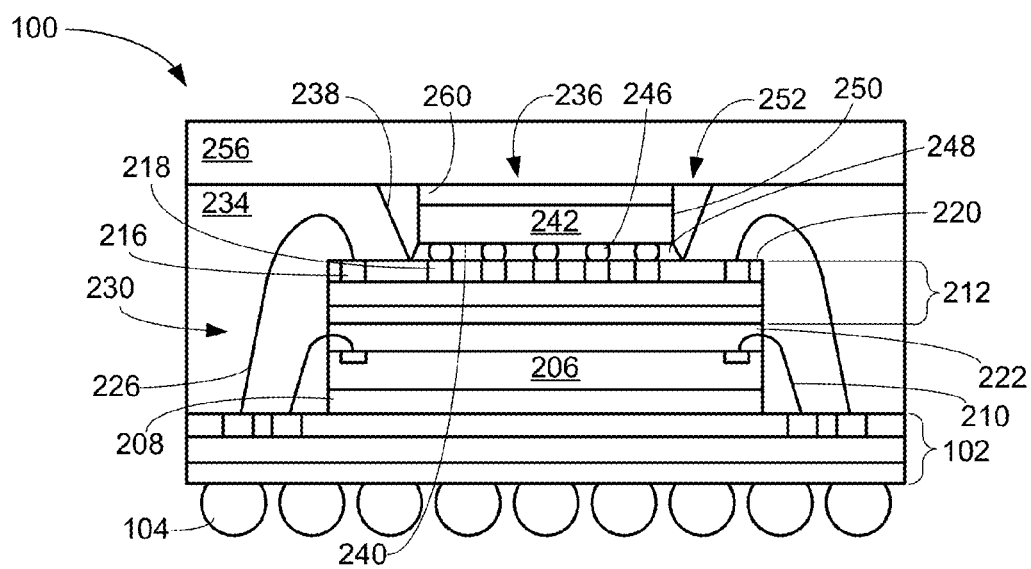
FIG. 2 is a cross-sectional view of the integrated circuit packaging system along a line 2-2 of FIG. 1.

Referring now to FIG. 2, therein is shown a cross-sectional view of the integrated circuit packaging system 100 along a line 2-2 of FIG. 1. A base integrated circuit device 206 can be mounted on or over the base substrate 102 opposite the package connectors 104 using a die attachment layer 208 can include of a bonding material, such as an adhesive, a glue, or a compound having adhesive properties.

Circuit interconnects 210 are defined as electrical conductors used to provide electrical connectivity between circuitry or conductive elements within the integrated circuit packaging system 100. The circuit interconnects can include wires, leads, or a combination thereof, provide electrical connectivity between the base integrated circuit device 206 and the base substrate 102. A substrate interposer 212 is defined as a substrate, similar to the base substrate 102, having one or more different layers of electrical conductors connecting to circuitry, periphery pads 216, or contact pads 218.

The periphery pads 216 surrounding the contact pads 218 and the contact pads 218 are exposed on a connection side 220 of the substrate interposer 212. The periphery pads 216 and the contact pads 218, similar to the periphery pads 216, provide electrical connectivity with contents of the substrate interposer 212.

A side of the substrate interposer 212 opposite the connection side 220 can be mounted on the base integrated circuit device 206 and over the circuit interconnects 210 using a film attachment layer 222. The film attachment layer 222 can include a non-electrically conductive adhesive material capable of covering portions of the circuit interconnects 210 between the base integrated circuit device 206 and the substrate interposer 212.

Stack interconnects 226 can attach the periphery pads 216 to the base substrate 102. The stack interconnects 226 are formed of metal conductors that can include the circuit interconnects 210 or different interconnects functionally equivalent to the circuit interconnects 210. A package stack assembly 230 is defined as an assembly formed by the base integrated circuit device 206, the substrate interposer 212, the circuit interconnects 210, the stack interconnects 226, the die attachment layer 208, and the film attachment layer 222.

An encapsulation 234 having a cavity 236 is formed over the package stack assembly 230 and covering a side of the base substrate 102 attached to the package stack assembly 230. The cavity 236 is directly over and exposing an area having the contact pads 218 of the substrate interposer 212 of the package stack assembly 230.

The encapsulation 234 forms tapered sides 238 of the cavity 236 resulting in an open end of the cavity 236 having a horizontal width greater than a horizontal width of a narrowed end of the cavity 236 closest to the contact pads 218 opposite the open end. The cavity 236 is widest at the open end of the cavity 236.

The horizontal width at the narrowed end of the cavity 236 is smaller than at any other horizontal width of the cavity 236. The encapsulation 234 is thermally conductive and covers, protects, and hermetically seals the package stack assembly 230 while exposing the area of the substrate interposer 212 having the contact pads 218 to form a fan-in package on package structure.

An active side 240 of a recessed circuitry unit 242, such as a flip chip, an integrated circuit module, an electronic component, or any combination thereof, can be attached to the contact pads 218 exposed in the cavity 236 of the fan-in package on package structure. The recessed circuitry unit 242 has a vertical package height and a horizontal footprint area that is less than a vertical depth and a horizontal area at the narrowed end of the cavity 236, respectively.

For purposes of illustration, the recessed circuitry unit 242 is shown as a single flip chip. It is understood that the recessed circuitry unit 242 can include one or more components. For example, the recessed circuitry unit 242 can include an integrated circuit module, a discrete inductor, and a discrete resistor.

A side of the recessed circuitry unit 242 opposite the active side 240 is coplanar with or below the open end of the cavity 236. Module connectors 246, similar to but smaller than the package connectors 104, can be used to connect or attach the active side 240 to the contact pads 218.

An underfill 248 can be applied between the active side 240 of the recessed circuitry unit 242 and the connection side 220 of the substrate interposer 212 of the package stack assembly 230. The underfill 248, formed from a non-electrically conductive material, surrounds the module connectors 246 and the contact pads 218. The underfill 248 can be thermally conductive.

At least a portion of non-horizontal sides 250, opposite one another, of the recessed circuitry unit 242 is separated from the tapered sides 238 of the cavity 236. The tapered sides 238, sides of the underfill 248 exposed between the active side 240, and the non-horizontal sides 250 of the recessed circuitry unit 242, form chambers 252 in the cavity 236, such as a crevices, gaps, or openings, having non-parallel interior sides.

For illustrative purposes, the chambers 252 are shown on the non-horizontal sides 250 of the recessed circuitry unit 242. It is understood that that there can be any number of the chambers 252. For example, there can be many of the chambers 252 joined or abutted together and surrounding the recessed circuitry unit 242.

A thermal structure 256 can be mounted over the recessed circuitry unit 242, the cavity 236, the chambers 252, and the encapsulation 234. The thermal structure 256 is defined a structure formed of material with heat absorbing or heat radiating properties and can include a heat slug, a panel having a side covered with projecting fins, hollowed tubes, or channels, or a combination thereof.

The thermal structure 256 can be solid or centrally hollow and filled with a thermal conductive compound such as a gel, a liquid, or a thermal enhancing material. A portion of the thermal structure 256 vertically over the recessed circuitry is connected or attached directly on the recessed circuitry unit 242 using a thermal adhesive 260.

Portions of the thermal structure 256 vertically over the encapsulation 234 are abutted and in direct contact with the encapsulation 234. The thermal adhesive 260 is an adhesive having thermal conductive properties similar to a thermal conductive epoxy, glue, or adhesive film.

The thermal adhesive 260 can include a catalyzer using a thermal interface material (TIM). The package stack assembly 230 or thermal fan in package on package can quickly emit heat through the heat slug and the conductive epoxy or the thermal interface material (TIM) used as a vehicle for the spreading of heat.

For purposes of illustration, the thermal structure 256 is shown attached directly on the recessed circuitry unit 242 using the thermal adhesive 260. It is understood that the thermal structure 256 can be attached directly to the encapsulation 234, the recessed circuitry unit 242, or to the chambers 252. For example, the thermal adhesive 260 can be used to attach a portion of the thermal structure 256 vertically over the tapered sides 238 to the tapered sides 238 of the chambers 252. The thermal adhesive 260 can optionally be applied into the chambers 252 and used to fill the chambers 252 to enhance thermal conductivity between the recessed circuitry unit 242 and the encapsulation 234 or the thermal structure 256.

For purposes of illustration, the base substrate 102 is shown having three different layers with each of the different layers including the conductive material for connectivity routing and distribution. The base substrate 102 can have any number of layers. For example, the base substrate 102 can have five different layers.

It has been discovered that the combination of the thermal structure 256, the chambers 252, and the thermal adhesive 260 eliminates heat build-up of the recessed circuitry unit 242 resulting in improved product reliability and circuit performance.

It has also been discovered that non-parallel interior sides of the chambers 252 formed by the tapered sides 238, the underfill 248, and the non-horizontal sides 250 of the recessed circuitry unit 242 deflect radiated heat from the package stack assembly 230 or the encapsulation 234 to the recessed circuitry unit 242 to eliminate damage of the recessed circuitry unit 242.

It has further been discovered that the combination of the thermal structure 256 over the chambers 252 and the non-parallel interior sides of the chambers 252 improves the transfer of heat from the recessed circuitry unit 242 resulting in a lower intrinsic operating temperature of the recessed circuitry unit 242 and a longer product life.

It has yet further been discovered that the chambers 252 filled with the thermal adhesive 260 results in maximized heat distribution between the thermal structure 256, the package stack assembly 230, the encapsulation 234, and the base substrate 102 to prevent structural stress induced failures, including package deformation or delamination, due to temperature differentials.

It has yet further been discovered that the non-parallel interior sides of the chambers 252 provide increased surface areas for improved thermal absorption or deflection between the encapsulation 234, the recessed circuitry unit 242, the thermal structure 256, the thermal adhesive 260, or the underfill 248 for a superior product mean time before failure.

Figure 3:
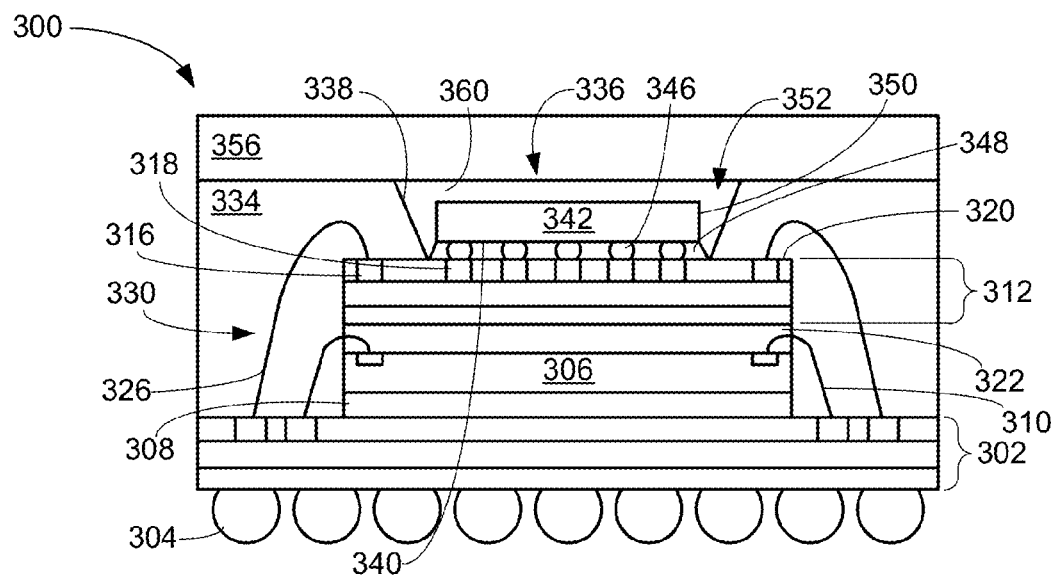
FIG. 3 is a cross-sectional view of an integrated circuit packaging system in a second embodiment of the present invention.

Referring now to FIG. 3, therein is shown a cross-sectional view of an integrated circuit packaging system 300 in a second embodiment of the present invention. Shown is a base substrate 302 having package connectors 304 exposed from the base substrate 302. The base substrate 302, such as a substrate, an interposer, a circuit board, or a laminate, includes conductive material to provide electrical connectivity within and between sides of the base substrate 302.

The package connectors 304 are defined as solder balls, conductive pins, leads, or conductive connectors used to provide connectivity between the integrated circuit packaging system 300 and a next level of integration (not shown) such as a printed circuit board or a component with integrated circuitry. The package connectors 304 can be formed from an electrically conductive material that can include solder, aluminum, copper, or a mixed alloyed combination thereof.

The package connectors 304 can be of different shapes or distributed on the base substrate 302 differently. For example, the package connectors 304 can be oval shaped or distributed having an offset from a center of the side of the base substrate 302 towards the periphery of the base substrate 302.

A base integrated circuit device 306 is mounted on the base substrate 302 opposite the package connectors 304 using a die attachment layer 308 can include a bonding material, such as an adhesive, a glue, or a compound having adhesive properties.

Circuit interconnects 310 are defined as electrical conductors used to provide electrical connectivity between circuitry or conductive elements within the integrated circuit packaging system 300. The circuit interconnects can include wires, leads, or a combination thereof, provide electrical connectivity between the base integrated circuit device 306 and the base substrate 302. A substrate interposer 312 is defined as a substrate, similar to the base substrate 302, having one or more different layers of electrical conductors connecting to circuitry, periphery pads 316, or contact pads 318.

The periphery pads 316 surrounding the contact pads 318 and the contact pads 318 are exposed on a connection side 320 of the substrate interposer 312. The periphery pads 316 and the contact pads 318, similar to the periphery pads 316, provide electrical connectivity with contents of the substrate interposer 312.

A side of the substrate interposer 312 opposite the connection side 320 can be mounted on the base integrated circuit device 306 and over the circuit interconnects 310 using a film attachment layer 322. The film attachment layer 322 can include a non-electrically conductive adhesive material capable of covering portions of the circuit interconnects 310 between the base integrated circuit device 306 and the substrate interposer 312.

Stack interconnects 326 can attach the periphery pads 316 to the base substrate 302. The stack interconnects 326 are formed of metal conductors that can include the circuit interconnects 310 or different interconnects functionally equivalent to the circuit interconnects 310. A package stack assembly 330 is defined as an assembly formed by the base integrated circuit device 306, the substrate interposer 312, the circuit interconnects 310, the stack interconnects 326, the die attachment layer 308, and the film attachment layer 322.

An encapsulation 334 having a cavity 336 is formed over the package stack assembly 330 and covering a side of the base substrate 302 attached to the package stack assembly 330. The cavity 336 is directly over and exposing an area having the contact pads 318 of the substrate interposer 312 of the package stack assembly 330.

The encapsulation 334 forms tapered sides 338 of the cavity 336 resulting in an open end of the cavity 336 having a horizontal width greater than a horizontal width of a narrowed end of the cavity 336 closest to the contact pads 318 opposite the open end. The cavity 336 is widest at the open end of the cavity 336.

The horizontal width at the narrowed end of the cavity 336 is smaller than at any other horizontal width of the cavity 336. The encapsulation 334 is thermally conductive and covers, protects, and hermetically seals the package stack assembly 330 while exposing the area of the substrate interposer 312 having the contact pads 318 to form a fan-in package on package structure.

An active side 340 of a recessed circuitry unit 342, such as a flip chip, an integrated circuit module, an electronic component, or any combination thereof, can be attached to the contact pads 318 exposed in the cavity 336 of the fan-in package on package structure. The recessed circuitry unit 342 has a vertical package height and a horizontal footprint area that is less than a vertical depth and a horizontal area at the narrowed end of the cavity 336, respectively.

For purposes of illustration, the recessed circuitry unit 342 is shown as a single flip chip. It is understood that the recessed circuitry unit 342 can include one or more components. For example, the recessed circuitry unit 342 can include an integrated circuit module, a discrete inductor, and a discrete resistor.

A side of the recessed circuitry unit 342 opposite the active side 340 is coplanar with or below the open end of the cavity 336. Module connectors 346, similar to but smaller than the package connectors 304, can be used to connect or attach the active side 340 to the contact pads 318.

An underfill 348 can be applied between the active side 340 and the connection side 320. The underfill 348, formed from a non-electrically conductive material, surrounds the module connectors 346 and the contact pads 318. The underfill 348 can be thermally conductive.

At least a portion of non-horizontal sides 350, opposite one another, of the recessed circuitry unit 342 is separated from the tapered sides 338 of the cavity 336. The tapered sides 338, sides of the underfill 348 exposed between the active side 340, and the non-horizontal sides 350 of the recessed circuitry unit 342 form chambers 352 in the cavity 336, such as a crevices, gaps, or openings, having non-parallel interior sides.

For illustrative purposes, the chambers 352 are shown on the non-horizontal sides 350 of the recessed circuitry unit 342. It is understood that that there can be any number of the chambers 352. For example, there can be many of the chambers 352 joined or abutted together and surrounding the recessed circuitry unit 342.

A thermal structure 356 can be mounted over the recessed circuitry unit 342, the cavity 336, the chambers 352, and the encapsulation 334. The thermal structure 356 is defined a structure formed of material with heat absorbing or heat radiating properties and can include a heat slug, a panel having a side covered with projecting fins, hollowed tubes, or channels, or a combination thereof.

The thermal structure 356 can be solid or centrally hollow and filled with a thermal conductive compound such as a gel, a liquid, or a thermal enhancing material. A portion of the thermal structure 356 vertically over the recessed circuitry unit 342 is connected or attached directly on the recessed circuitry unit 342 using a thermal adhesive 360 having thermal conductive properties such as a thermal conductive epoxy, glue, or adhesive film.

Portions of the thermal structure 356 vertically over the encapsulation 334 is abutted and in direct contact with the encapsulation 334. The thermal adhesive 360 can fill the cavity 336 and include a catalyzer using a thermal interface material (TIM).

The package stack assembly 330 or thermal fan in package on package can quickly emit heat through the heat slug and the conductive epoxy or the thermal interface material (TIM) used as a vehicle for the spreading of heat. The thermal adhesive 360 is applied into the chambers 352 and used to fill the chambers 352 to enhance thermal conductivity between the recessed circuitry unit 342 and the encapsulation 334 or the thermal structure 356.

For purposes of illustration, the base substrate 302 is shown having three different layers with each of the different layers including the conductive material for connectivity routing and distribution. The base substrate 302 can have any number of layers. For example, the base substrate 302 can have five different layers.

It has been discovered that the combination of the thermal structure 356, the chambers 352, and the thermal adhesive 360 eliminates heat build-up of the recessed circuitry unit 342 resulting in improved product reliability and circuit performance.

It has also been discovered that non-parallel interior sides of the chambers 352 formed by the tapered sides 338, the underfill 348, and the non-horizontal sides 350 of the recessed circuitry unit 342 deflects radiated heat from the package stack assembly 330 or the encapsulation 334 to the recessed circuitry unit 342 to eliminate damage of the recessed circuitry unit 342.

It has further been discovered that the combination of the thermal structure 356 over the chambers 352 and the non-parallel interior sides of the chambers 352 improves the transfer of heat from the recessed circuitry unit 342 resulting in a lower intrinsic operating temperature of the recessed circuitry unit 342 and a longer product life.

It has yet further been discovered that the chambers 352 filled with the thermal adhesive 360 results in maximized heat distribution between the thermal structure 356, the package stack assembly 330, the encapsulation 334, and the base substrate 102 to prevent structural stress induced failures, including package deformation or delamination, due to temperature differentials.

It has yet further been discovered that the non-parallel interior sides of the chambers 352 provide increased surface areas for improved thermal absorption or deflection between the encapsulation 334, the recessed circuitry unit 342, the thermal structure 356, the thermal adhesive 360, or the underfill 348 for a superior product mean time before failure.

Figure 4:
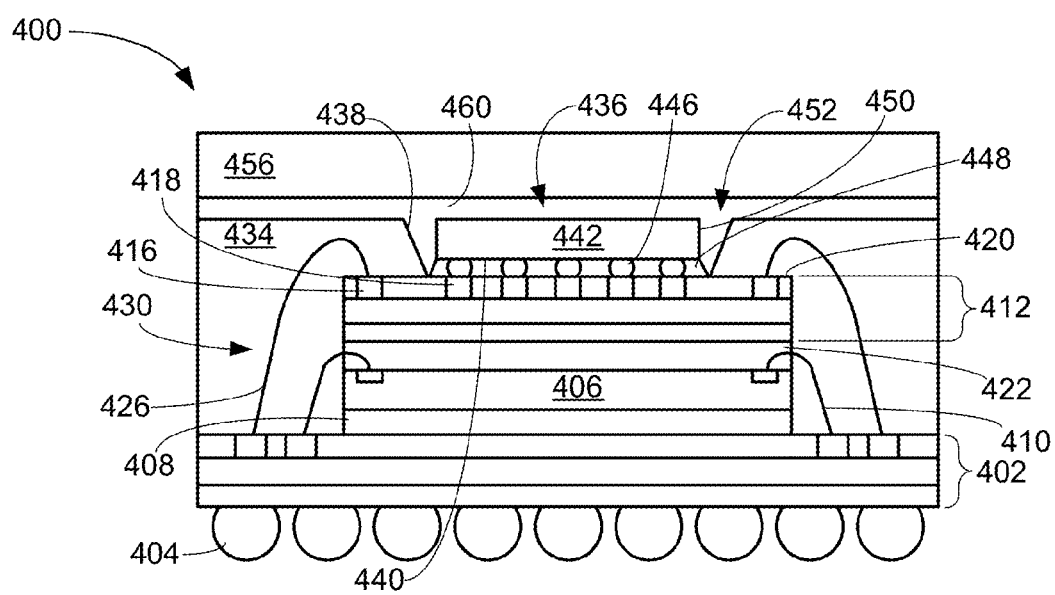
FIG. 4 is a cross-sectional view of an integrated circuit packaging system in a third embodiment of the present invention.

Referring now to FIG. 4, therein is shown a cross-sectional view of an integrated circuit packaging system 400 in a third embodiment of the present invention. Shown is a base substrate 402 having package connectors 404 exposed from the base substrate 402. The base substrate 402, such as a substrate, an interposer, a circuit board, or a laminate, includes conductive material to provide electrical connectivity within and between sides of the base substrate 402.

The package connectors 404 are defined as solder balls, conductive pins, leads, or conductive connectors used to provide connectivity between the integrated circuit packaging system 400 and a next level of integration (not shown) such as a printed circuit board or a component with integrated circuitry. The package connectors 404 can be formed from an electrically conductive material that can include solder, aluminum, copper, or a mixed alloyed combination thereof.

The package connectors 404 can be of different shapes or distributed on the base substrate 402 differently. For example, the package connectors 404 can be oval shaped or distributed having an offset from a center of the side of the base substrate 402 towards the periphery of the base substrate 402.

A base integrated circuit device 406 is mounted on the base substrate 402 opposite the package connectors 404 using a die attachment layer 408 can include a bonding material, such as an adhesive, a glue, or a compound having adhesive properties.

Circuit interconnects 410 are defined as electrical conductors used to provide electrical connectivity between circuitry or conductive elements within the integrated circuit packaging system 400. The circuit interconnects can include wires, leads, or a combination thereof, provide electrical connectivity between the base integrated circuit device 406 and the base substrate 402. A substrate interposer 412 is defined as a substrate, similar to the base substrate 402, having one or more different layers of electrical conductors connecting to circuitry, periphery pads 416, or contact pads 418.

The periphery pads 416 surrounding the contact pads 418 and the contact pads 418 are exposed on a connection side 420 of the substrate interposer 412. The periphery pads 416 and the contact pads 418, similar to the periphery pads 416, provide electrical connectivity with contents of the substrate interposer 412.

A side of the substrate interposer 412 opposite the connection side 420 can be mounted on the base integrated circuit device 406 and over the circuit interconnects 410 using a film attachment layer 422. The film attachment layer 422 can include a non-electrically conductive adhesive material capable of covering portions of the circuit interconnects 410 between the base integrated circuit device 406 and the substrate interposer 412.

Stack interconnects 426 can attach the periphery pads 416 to the base substrate 402. The stack interconnects 426 are formed of metal conductors that can include the circuit interconnects 410 or different interconnects functionally equivalent to the circuit interconnects 410. A package stack assembly 430 is defined as an assembly formed by the base integrated circuit device 406, the substrate interposer 412, the circuit interconnects 410, the stack interconnects 426, the die attachment layer 408, and the film attachment layer 422.

An encapsulation 434 having a cavity 436 is formed over the package stack assembly 430 and covering a side of the base substrate 402 attached to the package stack assembly 430. The cavity 436 is directly over and exposing an area having the contact pads 418 of the substrate interposer 412 of the package stack assembly 430.

The encapsulation 434 forms tapered sides 438 of the cavity 436 resulting in an open end of the cavity 436 having a horizontal width greater than a horizontal width of a narrowed end of the cavity 436 closest to the contact pads 418 opposite the open end. The cavity 436 is widest at the open end of the cavity 436.

The horizontal width at the narrowed end of the cavity 436 is smaller than at any other horizontal width of the cavity 436. The encapsulation 434 is thermally conductive and covers, protects, and hermetically seals the package stack assembly 430 while exposing the area of the substrate interposer 412 having the contact pads 418 to form a fan-in package on package structure.

An active side 440 of a recessed circuitry unit 442, such as a flip chip, an integrated circuit module, an electronic component, or any combination thereof, can be attached to the contact pads 418 exposed in the cavity 436 of the fan-in package on package structure. The recessed circuitry unit 442 has a vertical package height less than or equal to a vertical depth of the cavity. The recessed circuitry unit 442 has a horizontal footprint area that is less than a horizontal area at the narrowed end of the cavity 436.

For purposes of illustration, the recessed circuitry unit 442 is shown as a single flip chip. It is understood that the recessed circuitry unit 442 can include one or more components. For example, the recessed circuitry unit 442 can include an integrated circuit module, a discrete inductor, and a discrete resistor.

A side of the recessed circuitry unit 442 opposite the active side 440 is coplanar with or below the open end of the cavity 436. Module connectors 446, similar to but smaller than the package connectors 404, can be used to connect or attach the active side 440 to the contact pads 418.

An underfill 448 can be applied between the active side 440 and the connection side 420. The underfill 448, formed from a non-electrically conductive material, surrounds the module connectors 446 and the contact pads 418. The underfill 448 can be thermally conductive.

At least a portion of non-horizontal sides 450, opposite one another, of the recessed circuitry unit 442 is separated from the tapered sides 438 of the cavity 436. The tapered sides 438, sides of the underfill 448 exposed between the active side 440, and the non-horizontal sides 450 of the recessed circuitry unit 442 form chambers 452 in the cavity 436, such as a crevices, gaps, or openings, having non-parallel interior sides.

For illustrative purposes, the chambers 452 are shown on the non-horizontal sides 450 of the recessed circuitry unit 442. It is understood that that there can be any number of the chambers 452. For example, there can be many of the chambers 452 joined or abutted together and surrounding the recessed circuitry unit 442.

A thermal structure 456 is mounted over the recessed circuitry unit 442, the cavity 436, the chambers 452, and the encapsulation 434. The thermal structure 456 is defined a structure formed of material with heat absorbing or heat radiating properties and can include a heat slug, a panel having a side covered with projecting fins, hollowed tubes, or channels, or a combination thereof.

The thermal structure 456 can be solid or centrally hollow and filled with a thermal conductive compound such as a gel, a liquid, or a thermal enhancing material. The thermal structure 456 is connected or attached directly on the recessed circuitry unit 442 and the encapsulation 434 using a thermal adhesive 460 having thermal conductive properties such as a thermal conductive epoxy, glue, or adhesive film. The thermal adhesive 460 applied between the thermal structure 456 and the encapsulation 434 and the recessed circuitry unit 442 separates the thermal structure 456 from direct contact with the encapsulation 434 and the recessed circuitry unit 442.

The thermal adhesive 460 fills the cavity 436 and can include a catalyzer using a thermal interface material (TIM). The package stack assembly 430 or thermal fan in package on package can quickly emit heat through the heat slug and the conductive epoxy or the thermal interface material (TIM) used as a vehicle for the spreading of heat.

The thermal adhesive 460 can be exposed from and coplanar to periphery sides of the thermal structure 456 and of the encapsulation 434. The thermal adhesive 460 fills the chambers 452 to enhance thermal conductivity between the recessed circuitry unit 442 and the encapsulation 434 or the thermal structure 456.

For purposes of illustration, the base substrate 402 is shown having three different layers with each of the different layers including the conductive material for connectivity routing and distribution. The base substrate 402 can have any number of layers. For example, the base substrate 402 can have five different layers.

It has been discovered that the combination of the thermal structure 456, the chambers 452, and the thermal adhesive 460 eliminates heat build-up of the recessed circuitry unit 442 resulting in improved product reliability and circuit performance.

It has also been discovered that non-parallel interior sides of the chambers 452 formed by the tapered sides 438, the underfill 448, and the non-horizontal sides 450 of the recessed circuitry unit 442 deflects radiated heat from the package stack assembly 430 or the encapsulation 434 to the recessed circuitry unit 442 to eliminate damage of the recessed circuitry unit 442.

It has further been discovered that the combination of the thermal structure 456 over the chambers 452 and the non-parallel interior sides of the chambers 452 improves the transfer of heat from the recessed circuitry unit 442 resulting in a lower intrinsic operating temperature of the recessed circuitry unit 442 and a longer product life.

It has yet further been discovered that the chambers 452 filled with the thermal adhesive 460 results in maximized heat distribution between the thermal structure 456, the package stack assembly 430, the encapsulation 434, and the base substrate 102 to prevent structural stress induced failures, including package deformation or delamination, due to temperature differentials.

It has yet further been discovered that the non-parallel interior sides of the chambers 452 provide increased surface areas for improved thermal absorption or deflection between the encapsulation 434, the recessed circuitry unit 442, the thermal structure 456, the thermal adhesive 460, or the underfill 448 for a superior product mean time before failure.

Figure 5:
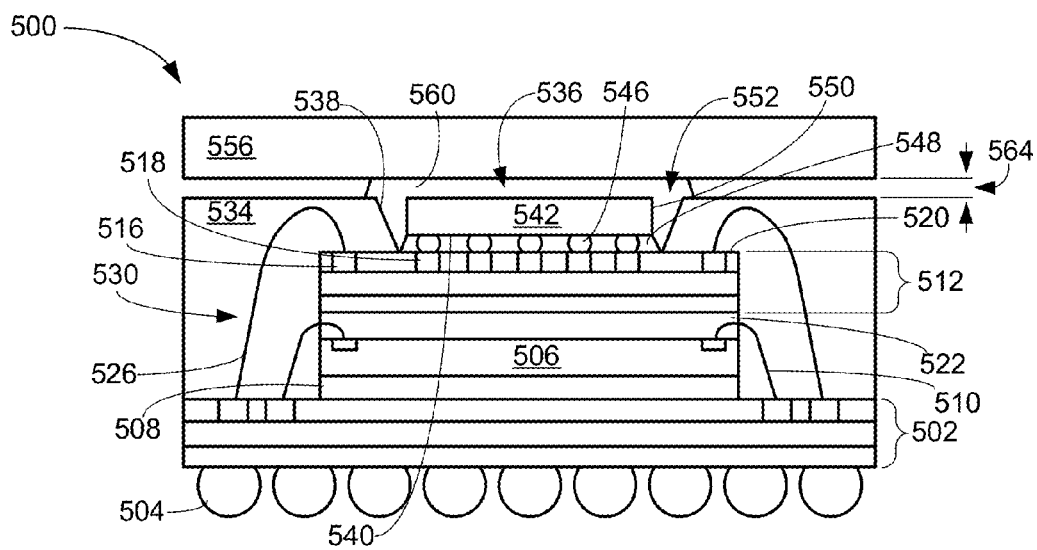
FIG. 5 is a cross-sectional view of an integrated circuit packaging system in a fourth embodiment of the present invention.

Referring now to FIG. 5, therein is shown a cross-sectional view of an integrated circuit packaging system 500 in a fourth embodiment of the present invention. Shown is a base substrate 502 having package connectors 504 exposed from the base substrate 502. The base substrate 502, such as a substrate, an interposer, a circuit board, or a laminate, includes conductive material to provide electrical connectivity within and between sides of the base substrate 502.

The package connectors 504 are defined as solder balls, conductive pins, leads, or conductive connectors used to provide connectivity between the integrated circuit packaging system 500 and a next level of integration (not shown) such as a printed circuit board or a component with integrated circuitry. The package connectors 504 can be formed from an electrically conductive material that can include solder, aluminum, copper, or a mixed alloyed combination thereof.

The package connectors 504 can be of different shapes or distributed on the base substrate 502 differently. For example, the package connectors 504 can be oval shaped or distributed having an offset from a center of the side of the base substrate 502 towards the periphery of the base substrate 502.

A base integrated circuit device 506 is mounted on the base substrate 502 opposite the package connectors 504 using a die attachment layer 508 can include a bonding material, such as an adhesive, a glue, or a compound having adhesive properties.

Circuit interconnects 510 are defined as electrical conductors used to provide electrical connectivity between circuitry or conductive elements within the integrated circuit packaging system 500. The circuit interconnects can include wires, leads, or a combination thereof, provide electrical connectivity between the base integrated circuit device 506 and the base substrate 502. A substrate interposer 512 is defined as a substrate, similar to the base substrate 502, having one or more different layers of electrical conductors connecting to circuitry, periphery pads 516, or contact pads 518.

The periphery pads 516 surrounding the contact pads 518 and the contact pads 518 are exposed on a connection side 520 of the substrate interposer 512. The periphery pads 516 and the contact pads 518, similar to the periphery pads 516, provide electrical connectivity with contents of the substrate interposer 512.

A side of the substrate interposer 512 opposite the connection side 520 can be mounted on the base integrated circuit device 506 and over the circuit interconnects 510 using a film attachment layer 522. The film attachment layer 522 can include a non-electrically conductive adhesive material capable of covering portions of the circuit interconnects 510 between the base integrated circuit device 506 and the substrate interposer 512.

Stack interconnects 526 can attach the periphery pads 516 to the base substrate 502. The stack interconnects 526 are formed of metal conductors that can include the circuit interconnects 510 or different interconnects functionally equivalent to the circuit interconnects 510. A package stack assembly 530 is defined as an assembly formed by the base integrated circuit device 506, the substrate interposer 512, the circuit interconnects 510, the stack interconnects 526, the die attachment layer 508, and the film attachment layer 522.

An encapsulation 534 having a cavity 536 is formed over the package stack assembly 530 and covering a side of the base substrate 502 attached to the package stack assembly 530. The cavity 536 is directly over and exposing an area having the contact pads 518 of the substrate interposer 512 of the package stack assembly 530.

The encapsulation 534 forms tapered sides 538 of the cavity 536 resulting in an open end of the cavity 536 having a horizontal width greater than a horizontal width of a narrowed end of the cavity 536 closest to the contact pads 518 opposite the open end. The cavity 536 is widest at the open end of the cavity 536.

The horizontal width at the narrowed end of the cavity 536 is smaller than at any other horizontal width of the cavity 536. The encapsulation 534 is thermally conductive and covers, protects, and hermetically seals the package stack assembly 530 while exposing the area of the substrate interposer 512 having the contact pads 518 to form a fan-in package on package structure.

An active side 540 of a recessed circuitry unit 542, such as a flip chip, an integrated circuit module, an electronic component, or any combination thereof, can be attached to the contact pads 518 exposed in the cavity 536 of the fan-in package on package structure. The recessed circuitry unit 542 has a vertical package height less than or equal to a vertical depth of the cavity. The recessed circuitry unit 542 has a horizontal footprint area that is less than a horizontal area at the narrowed end of the cavity 536.

For purposes of illustration, the recessed circuitry unit 542 is shown as a single flip chip. It is understood that the recessed circuitry unit 542 can include one or more components. For example, the recessed circuitry unit 542 can include an integrated circuit module, a discrete inductor, and a discrete resistor.

A side of the recessed circuitry unit 542 opposite the active side 540 is coplanar with or below the open end of the cavity 536. Module connectors 546, similar to but smaller than the package connectors 504, can be used to connect or attach the active side 540 to the contact pads 518.

An underfill 548 can be applied between the active side 540 and the connection side 520. The underfill 548, formed from a non-electrically conductive material, surrounds the module connectors 546 and the contact pads 518. The underfill 548 can be thermally conductive.

At least a portion of non-horizontal sides 550, opposite one another, of the recessed circuitry unit 542 is separated from the tapered sides 538 of the cavity 536. The tapered sides 538, sides of the underfill 548 exposed between the active side 540, and the non-horizontal sides 550 of the recessed circuitry unit 542 form chambers 552 in the cavity 536, such as a crevices, gaps, or openings, having non-parallel interior sides.

For illustrative purposes, the chambers 552 are shown on the non-horizontal sides 550 of the recessed circuitry unit 542. It is understood that that there can be any number of the chambers 552. For example, there can be many of the chambers 552 joined or abutted together and surrounding the recessed circuitry unit 542.

A thermal structure 556 can be mounted over the recessed circuitry unit 542, the cavity 536, the chambers 552, and the encapsulation 534. The thermal structure 556 is defined a structure formed of material with heat absorbing or heat radiating properties and can include a heat slug, a panel having a side covered with projecting fins, hollowed tubes, or channels, or a combination thereof.

The thermal structure 556 can be solid or centrally hollow and filled with a thermal conductive compound such as a gel, a liquid, or a thermal enhancing material. A portion of the thermal structure 556 vertically over the recessed circuitry unit 542 is connected or attached directly on the recessed circuitry unit 542 and on a portion of the encapsulation 534 surrounding the cavity 536 using a thermal adhesive 560 having thermal conductive properties such as a thermal conductive epoxy, glue, or adhesive film.

The thermal adhesive 560 fills the cavity 536 and can include a catalyzer using a thermal interface material (TIM). The package stack assembly 530 or thermal fan in package on package can quickly emit heat through the heat slug and the conductive epoxy or the thermal interface material (TIM) used as a vehicle for the spreading of heat. The thermal adhesive 560 is applied into the chambers 552 and used to fill the chambers 552 to enhance thermal conductivity between the recessed circuitry unit 542 and the encapsulation 534 or the thermal structure 556.

A separation gap 564 can be formed with portions of a side of the encapsulation 534 directly facing and coplanar with portions of a side of the thermal structure 556. The separation gap 564 is defined as a space, surrounding a perimeter of the cavity 536, separating the encapsulation 534 and the thermal structure 556 from direct contact with one another. The thermal adhesive 560 surrounding the perimeter of the cavity 536 can be exposed from within the separation gap 564.

For purposes of illustration, the base substrate 502 is shown having three different layers with each of the different layers including the conductive material for connectivity routing and distribution. The base substrate 502 can have any number of layers. For example, the base substrate 502 can have five different layers.

It has been discovered that the combination of the thermal structure 556, the chambers 552, and the thermal adhesive 560 eliminates heat build-up of the recessed circuitry unit 542 resulting in improved product reliability and circuit performance.

It has also been discovered that the separation gap 564 between the encapsulation 534 and the thermal structure 556 provides maximum heat transfer between the recessed circuitry unit 542 and the thermal structure 556, while preventing excess heat from the encapsulation 534 to the thermal structure 556 or the recessed circuitry unit 542, resulting in increased package due optimized thermal budgeting.

It has further been discovered that the combination of the thermal structure 556 over the chambers 552 and the non-parallel interior sides of the chambers 552 improves the transfer of heat from the recessed circuitry unit 542 resulting in a lower intrinsic operating temperature of the recessed circuitry unit 542 and a longer product life.

It has yet further been discovered that the chambers 552 filled with the thermal adhesive 560 results in maximized heat distribution between the thermal structure 556, the package stack assembly 530, the encapsulation 534, and the base substrate 102 to prevent structural stress induced failures, including package deformation or delamination, due to temperature differentials.

It has yet further been discovered that the non-parallel interior sides of the chambers 552 provide increased surface areas for improved thermal absorption or deflection between the encapsulation 534, the recessed circuitry unit 542, the thermal structure 556, the thermal adhesive 560, or the underfill 548 for a superior product mean time before failure.

Figure 6:
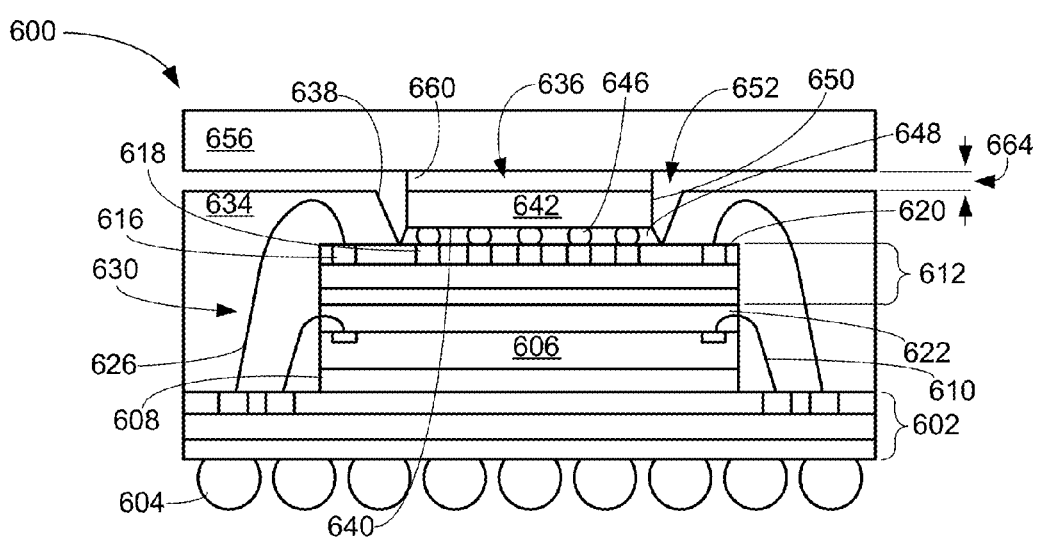
FIG. 6 is a cross-sectional view of an integrated circuit packaging system in a fifth embodiment of the present invention.

Referring now to FIG. 6, therein is shown a cross-sectional view of an integrated circuit packaging system 600 in a fifth embodiment of the present invention. Shown is a base substrate 602 having package connectors 604 exposed from the base substrate 602. The base substrate 602, such as a substrate, an interposer, a circuit board, or a laminate, includes conductive material to provide electrical connectivity within and between sides of the base substrate 602.

The package connectors 604 are defined as solder balls, conductive pins, leads, or conductive connectors used to provide connectivity between the integrated circuit packaging system 600 and a next level of integration (not shown) such as a printed circuit board or a component with integrated circuitry. The package connectors 604 can be formed from an electrically conductive material that can include solder, aluminum, copper, or a mixed alloyed combination thereof.

The package connectors 604 can be of different shapes or distributed on the base substrate 602 differently. For example, the package connectors 604 can be oval shaped or distributed having an offset from a center of the side of the base substrate 602 towards the periphery of the base substrate 602.

A base integrated circuit device 606 is mounted on the base substrate 602 opposite the package connectors 604 using a die attachment layer 608 can include a bonding material, such as an adhesive, a glue, or a compound having adhesive properties.

Circuit interconnects 610 are defined as electrical conductors used to provide electrical connectivity between circuitry or conductive elements within the integrated circuit packaging system 600. The circuit interconnects can include wires, leads, or a combination thereof, provide electrical connectivity between the base integrated circuit device 606 and the base substrate 602. A substrate interposer 612 is defined as a substrate, similar to the base substrate 602, having one or more different layers of electrical conductors connecting to circuitry, periphery pads 616, or contact pads 618.

The periphery pads 616 surrounding the contact pads 618 and the contact pads 618 are exposed on a connection side 620 of the substrate interposer 612. The periphery pads 616 and the contact pads 618, similar to the periphery pads 616, provide electrical connectivity with contents of the substrate interposer 612.

A side of the substrate interposer 612 opposite the connection side 620 can be mounted on the base integrated circuit device 606 and over the circuit interconnects 610 using a film attachment layer 622. The film attachment layer 622 can include a non-electrically conductive adhesive material capable of covering portions of the circuit interconnects 610 between the base integrated circuit device 606 and the substrate interposer 612.

Stack interconnects 626 can attach the periphery pads 616 to the base substrate 602. The stack interconnects 626 are formed of metal conductors that can include the circuit interconnects 610 or different interconnects functionally equivalent to the circuit interconnects 610. A package stack assembly 630 is defined as an assembly formed by the base integrated circuit device 606, the substrate interposer 612, the circuit interconnects 610, the stack interconnects 626, the die attachment layer 608, and the film attachment layer 622.

An encapsulation 634 having a cavity 636 is formed over the package stack assembly 630 and covering a side of the base substrate 602 attached to the package stack assembly 630. The cavity 636 is directly over and exposing an area having the contact pads 618 of the substrate interposer 612 of the package stack assembly 630.

The encapsulation 634 forms tapered sides 638 of the cavity 636 resulting in an open end of the cavity 636 having a horizontal width greater than a horizontal width of a narrowed end of the cavity 636 closest to the contact pads 618 opposite the open end. The cavity 636 is widest at the open end of the cavity 636.

The horizontal width at the narrowed end of the cavity 636 is smaller than at any other horizontal width of the cavity 636. The encapsulation 634 is thermally conductive and covers, protects, and hermetically seals the package stack assembly 630 while exposing the area of the substrate interposer 612 having the contact pads 618 to form a fan-in package on package structure.

An active side 640 of a recessed circuitry unit 642, such as a flip chip, an integrated circuit module, an electronic component, or any combination thereof, can be attached to the contact pads 618 exposed in the cavity 636 of the fan-in package on package structure. The recessed circuitry unit 642 has a vertical package height less than or equal to a vertical depth of the cavity. The recessed circuitry unit 642 has a horizontal footprint area that is less than a horizontal area at the narrowed end of the cavity 636.

For purposes of illustration, the recessed circuitry unit 642 is shown as a single flip chip. It is understood that the recessed circuitry unit 642 can include one or more components. For example, the recessed circuitry unit 642 can include an integrated circuit module, a discrete inductor, and a discrete resistor.

A side of the recessed circuitry unit 642 opposite the active side 640 is coplanar with or below the open end of the cavity 636. Module connectors 646, similar to but smaller than the package connectors 604, can be used to connect or attach the active side 640 to the contact pads 618.

An underfill 648 can be applied between the active side 640 and the connection side 620. The underfill 648, formed from a non-electrically conductive material, surrounds the module connectors 646 and the contact pads 618. The underfill 648 can be thermally conductive.

At least a portion of non-horizontal sides 650, opposite one another, of the recessed circuitry unit 642 is separated from the tapered sides 638 of the cavity 636. The tapered sides 638, sides of the underfill 648 exposed between the active side 640, and the non-horizontal sides 650 of the recessed circuitry unit 642 form chambers 652 in the cavity 636, such as a crevices, gaps, or openings, having non-parallel interior sides.

For illustrative purposes, the chambers 652 are shown on the non-horizontal sides 650 of the recessed circuitry unit 642. It is understood that that there can be any number of the chambers 652. For example, there can be many of the chambers 652 joined or abutted together and surrounding the recessed circuitry unit 642.

A thermal structure 656 can be mounted over the recessed circuitry unit 642, the cavity 636, the chambers 652, and the encapsulation 634. The thermal structure 656 is defined a structure formed of material with heat absorbing or heat radiating properties and can include a heat slug, a panel having a side covered with projecting fins, hollowed tubes, or channels, or a combination thereof.

The thermal structure 656 can be solid or centrally hollow and filled with a thermal conductive compound such as a gel, a liquid, or a thermal enhancing material. A portion of the thermal structure 656 vertically over the recessed circuitry unit 642 is connected or attached directly on the recessed circuitry unit 642 using a thermal adhesive 660 having thermal conductive properties such as a thermal conductive epoxy, glue, or adhesive film.

The thermal adhesive 660 can include a catalyzer using a thermal interface material (TIM). The package stack assembly 630 or thermal fan in package on package can quickly emit heat through the heat slug and the conductive epoxy or the thermal interface material (TIM) used as a vehicle for the spreading of heat. The chambers 652 of the cavity 636 are exposed from the thermal adhesive 660 to limit thermal conductivity between the recessed circuitry unit 642 and the encapsulation 634 or the thermal structure 656.

A separation gap 664 can be formed portions of a side of the encapsulation 634 directly facing and coplanar with portions of a side of the thermal structure 656. The separation gap 664 is defined as a space, surrounding a perimeter of the cavity 636, separating the encapsulation 634 and the thermal structure 656 from direct contact with one another. Portions of the chambers 652 and the thermal adhesive 660 between the recessed circuitry unit 642 and the thermal structure 656 can be exposed from within the separation gap 664.

For purposes of illustration, the base substrate 602 is shown having three different layers with each of the different layers including the conductive material for connectivity routing and distribution. The base substrate 602 can have any number of layers. For example, the base substrate 602 can have five different layers.

It has been discovered that the combination of the thermal structure 656, the chambers 652, and the thermal adhesive 660 eliminates heat build-up of the recessed circuitry unit 642 resulting in improved product reliability and circuit performance.

It has also been discovered that non-parallel interior sides of the chambers 652 formed by the tapered sides 638, the underfill 648, and the non-horizontal sides 650 of the recessed circuitry unit 642 deflect radiated heat from the package stack assembly 630 or the encapsulation 634 to the recessed circuitry unit 642 to eliminate damage of the recessed circuitry unit 642.

It has further been discovered that the separation gap 664 between the encapsulation 634 and the thermal structure 656 provides maximum heat transfer between the recessed circuitry unit 642 and the thermal structure 656, while minimizing thermal coupling with the chambers 652 or the encapsulation 634, resulting improved thermal dissipation due to optimized thermal budgeting.

It has yet further been discovered that the combination of the thermal structure 656 over the chambers 652 and the non-parallel interior sides of the chambers 652 maximizes the transfer of heat from the recessed circuitry unit 642 resulting in a lower operating temperatures of the recessed circuitry unit 642 and the package stack assembly 630 for improved product reliability.

It has yet further been discovered that the non-parallel interior sides of the chambers 652 provide increased surface areas for improved thermal absorption or deflection between the encapsulation 634, the recessed circuitry unit 642, the thermal structure 656, the thermal adhesive 660, or the underfill 648 for a superior product mean time before failure.

Figure 7:
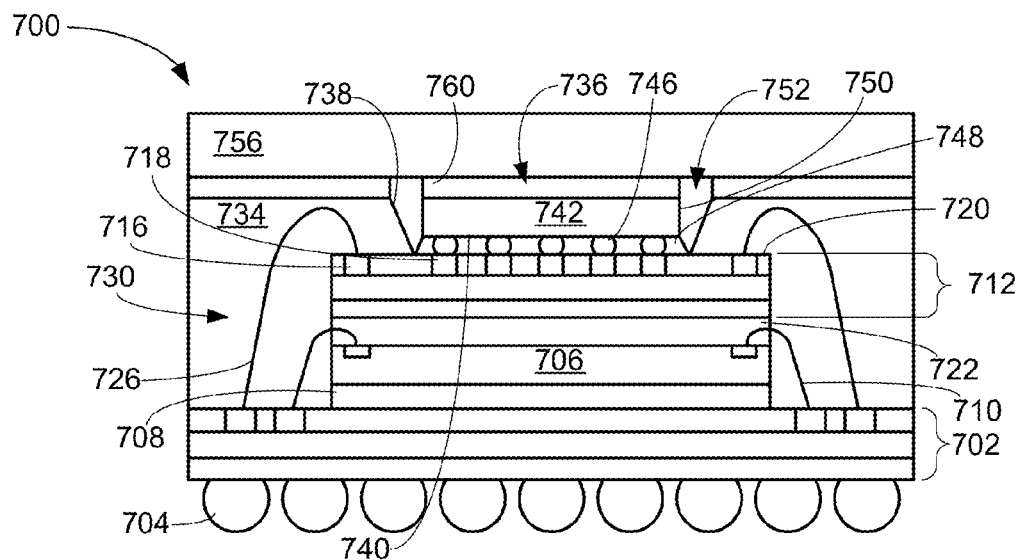
FIG. 7 is a cross-sectional view of an integrated circuit packaging system in a sixth embodiment of the present invention.

Referring now to FIG. 7, therein is shown a cross-sectional view of an integrated circuit packaging system 700 in a sixth embodiment of the present invention. Shown is a base substrate 702 having package connectors 704 exposed from the base substrate 702. The base substrate 702, such as a substrate, an interposer, a circuit board, or a laminate, includes conductive material to provide electrical connectivity within and between sides of the base substrate 702.

The package connectors 704 are defined as solder balls, conductive pins, leads, or conductive connectors used to provide connectivity between the integrated circuit packaging system 700 and a next level of integration (not shown) such as a printed circuit board or a component with integrated circuitry. The package connectors 704 can be formed from an electrically conductive material that can include solder, aluminum, copper, or a mixed alloyed combination thereof.

The package connectors 704 can be of different shapes or distributed on the base substrate 702 differently. For example, the package connectors 704 can be oval shaped or distributed having an offset from a center of the side of the base substrate 702 towards the periphery of the base substrate 702.

A base integrated circuit device 706 is mounted on the base substrate 702 opposite the package connectors 704 using a die attachment layer 708 can include a bonding material, such as an adhesive, a glue, or a compound having adhesive properties.

Circuit interconnects 710 are defined as electrical conductors used to provide electrical connectivity between circuitry or conductive elements within the integrated circuit packaging system 700. The circuit interconnects can include wires, leads, or a combination thereof, provide electrical connectivity between the base integrated circuit device 706 and the base substrate 702. A substrate interposer 712 is defined as a substrate, similar to the base substrate 702, having one or more different layers of electrical conductors connecting to circuitry, periphery pads 716, or contact pads 718.

The periphery pads 716 surrounding the contact pads 718 and the contact pads 718 are exposed on a connection side 720 of the substrate interposer 712. The periphery pads 716 and the contact pads 718, similar to the periphery pads 716, provide electrical connectivity with contents of the substrate interposer 712.

A side of the substrate interposer 712 opposite the connection side 720 can be mounted on the base integrated circuit device 706 and over the circuit interconnects 710 using a film attachment layer 722. The film attachment layer 722 can include a non-electrically conductive adhesive material capable of covering portions of the circuit interconnects 710 between the base integrated circuit device 706 and the substrate interposer 712.

Stack interconnects 726 can attach the periphery pads 716 to the base substrate 702. The stack interconnects 726 are formed of metal conductors that can include the circuit interconnects 710 or different interconnects functionally equivalent to the circuit interconnects 710. A package stack assembly 730 is defined as an assembly formed by the base integrated circuit device 706, the substrate interposer 712, the circuit interconnects 710, the stack interconnects 726, the die attachment layer 708, and the film attachment layer 722.

An encapsulation 734 having a cavity 736 is formed over the package stack assembly 730 and covering a side of the base substrate 702 attached to the package stack assembly 730. The cavity 736 is directly over and exposing an area having the contact pads 718 of the substrate interposer 712 of the package stack assembly 730.

The encapsulation 734 forms tapered sides 738 of the cavity 736 resulting in an open end of the cavity 736 having a horizontal width greater than a horizontal width of a narrowed end of the cavity 736 closest to the contact pads 718 opposite the open end. The cavity 736 is widest at the open end of the cavity 736.

The horizontal width at the narrowed end of the cavity 736 is smaller than at any other horizontal width of the cavity 736. The encapsulation 734 is thermally conductive and covers, protects, and hermetically seals the package stack assembly 730 while exposing the area of the substrate interposer 712 having the contact pads 718 to form a fan-in package on package structure.

An active side 740 of a recessed circuitry unit 742, such as a flip chip, an integrated circuit module, an electronic component, or any combination thereof, can be attached to the contact pads 718 exposed in the cavity 736 of the fan-in package on package structure. The recessed circuitry unit 742 has a vertical package height less than or equal to a vertical depth of the cavity. The recessed circuitry unit 742 has a horizontal footprint area that is less than a horizontal area at the narrowed end of the cavity 736.

For purposes of illustration, the recessed circuitry unit 742 is shown as a single flip chip. It is understood that the recessed circuitry unit 742 can include one or more components. For example, the recessed circuitry unit 742 can include an integrated circuit module, a discrete inductor, and a discrete resistor.

A side of the recessed circuitry unit 742 opposite the active side 740 is coplanar with or below the open end of the cavity 736. Module connectors 746, similar to but smaller than the package connectors 704, can be used to connect or attach the active side 740 to the contact pads 718.

An underfill 748 can be applied between the active side 740 and the connection side 720. The underfill 748, formed from a non-electrically conductive material, surrounds the module connectors 746 and the contact pads 718. The underfill 748 can be thermally conductive.

At least a portion of non-horizontal sides 750, opposite one another, of the recessed circuitry unit 742 is separated from the tapered sides 738 of the cavity 736. The tapered sides 738, sides of the underfill 748 exposed between the active side 740, and the non-horizontal sides 750 of the recessed circuitry unit 742 form chambers 752 in the cavity 736, such as a crevices, gaps, or openings, having non-parallel interior sides.

For illustrative purposes, the chambers 752 are shown on the non-horizontal sides 750 of the recessed circuitry unit 742. It is understood that that there can be any number of the chambers 752. For example, there can be many of the chambers 752 joined or abutted together and surrounding the recessed circuitry unit 742.

A thermal structure 756 can be mounted over the recessed circuitry unit 742, the cavity 736, the chambers 752, and the encapsulation 734. The thermal structure 756 is defined a structure formed of material with heat absorbing or heat radiating properties and can include a heat slug, a panel having a side covered with projecting fins, hollowed tubes, or channels, or a combination thereof.

The thermal structure 756 can be solid or centrally hollow and filled with a thermal conductive compound such as a gel, a liquid, or a thermal enhancing material. A portion of the thermal structure 756 vertically over the recessed circuitry unit 742 is connected or attached directly on the recessed circuitry unit 742 using a thermal adhesive 760 having thermal conductive properties such as a thermal conductive epoxy, glue, or adhesive film. Portions of the thermal structure 756 vertically over the encapsulation 734 is attached directly on the encapsulation 734 using the thermal adhesive 760. The thermal structure 756 prevents direct contact between the thermal structure 756 and the encapsulation 734 and the recessed circuitry unit 742.

The thermal adhesive 760 can surround the cavity 736 and include a catalyzer using a thermal interface material (TIM). The package stack assembly 730 or thermal fan in package on package can quickly emit heat through the heat slug and the conductive epoxy or the thermal interface material (TIM) used as a vehicle for the spreading of heat.

The thermal adhesive 760 can be exposed from and coplanar to periphery sides of the thermal structure 756 and of the encapsulation 734. The chambers 752 of the cavity 736 are vertically surrounded by the thermal adhesive 760 provide reduced thermal conductivity between the recessed circuitry unit 742 and the encapsulation 734 or the thermal structure 756 and thus limits thermal exchange between the non-horizontal sides 750 of the recessed circuitry unit 742 and the encapsulation 734.

For purposes of illustration, the base substrate 702 is shown having three different layers with each of the different layers including the conductive material for connectivity routing and distribution. The base substrate 702 can have any number of layers. For example, the base substrate 702 can have five different layers.

It has been discovered that the combination of the thermal structure 756, the chambers 752, and the thermal adhesive 760 eliminates heat build-up of the recessed circuitry unit 742 resulting in improved product reliability and circuit performance.

It has also been discovered that non-parallel interior sides of the chambers 752 surrounded by the thermal adhesive 760 deflects radiated heat from the package stack assembly 730 or the encapsulation 734 to the non-horizontal sides 750 of the recessed circuitry unit 742 to eliminate damage of the recessed circuitry unit 742.

It has further been discovered that the combination of the thermal structure 756 over the chambers 752 and the non-parallel interior sides of the chambers 752 improves the transfer of heat rising from the recessed circuitry unit 742 resulting in a lower intrinsic operating temperature of the recessed circuitry unit 742 and a longer product life.

It has yet further been discovered that the non-parallel interior sides of the chambers 752 provide increased surface areas for improved thermal absorption or deflection between the encapsulation 734, the recessed circuitry unit 742, the thermal structure 756, the thermal adhesive 760, or the underfill 748 for a superior product mean time before failure.

Figure 8:
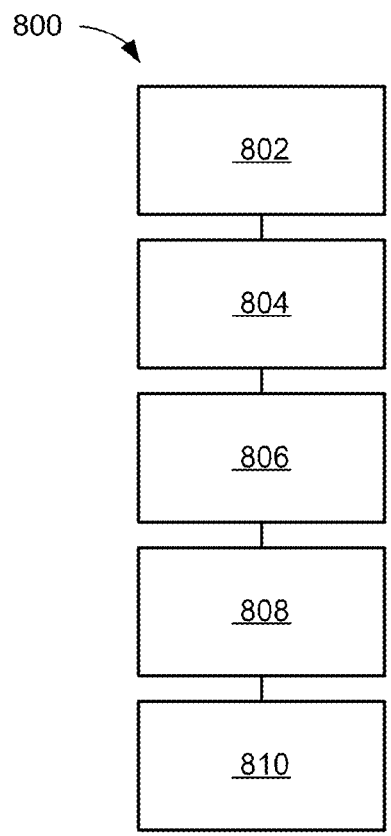
FIG. 8 is a flow chart of a method of manufacture of the integrated circuit packaging system in a further embodiment of the present invention.

Referring now to FIG. 8, therein is shown a flow chart of a method 800 of manufacture of the integrated circuit packaging system 100 in a further embodiment of the present invention. The method 800 includes: providing a base substrate in a block 802; attaching a package stack assembly, having a contact pad, on the base substrate in a block 804; applying an encapsulation having a cavity with a tapered side directly over the package stack assembly, the contact pad exposed in the cavity in a block 806; attaching a recessed circuitry unit in the cavity and on the contact pad, a chamber of the cavity formed by the recessed circuitry unit and the tapered side of the cavity in a block 808; and mounting a thermal structure over the recessed circuitry unit, the cavity, and the encapsulation in a block 810.

Thus, it has been discovered that the integrated circuit packaging system with the present invention furnishes important and heretofore unknown and unavailable solutions, capabilities, and functional aspects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing a base substrate having a package connector;
    attaching a package stack assembly having a contact pad on a side of the base substrate opposite and facing away from the package connector;
    applying an encapsulation having a cavity with a tapered side directly over the package stack assembly, the contact pad exposed in the cavity;
    attaching a recessed circuitry unit having a non-horizontal side in the cavity, the recessed circuitry unit on the contact pad, a chamber of the cavity formed by the non-horizontal side and the tapered side of the cavity; and
    mounting a thermal structure over the recessed circuitry unit, the cavity, and the encapsulation; and
    applying a thermal adhesive to the thermal structure, the encapsulation, and the recessed circuitry unit, the thermal adhesive separating the thermal structure from the encapsulation and the recessed circuitry unit.

2. The method as claimed in claim 1 further comprising applying an underfill around the contact pad between the recessed circuitry unit and the package stack assembly.

3. The method as claimed in claim 1 wherein applying the thermal adhesive includes applying the thermal adhesive in the chamber.

4. The method as claimed in claim 1 further comprising applying an underfill around the contact pad.

5. The method as claimed in claim 1 wherein applying the thermal adhesive includes attaching the thermal adhesive to the thermal structure, the recessed circuitry unit, and interior of the cavity.

6. An integrated circuit packaging system comprising:
- a base substrate;
- a package stack assembly having a contact pad attached on a side of the base substrate wherein the base substrate includes a package connector on a side of base substrate that faces away from the package stack assembly;
- an encapsulation having a cavity with a tapered side applied directly over the package stack assembly, the contact pad exposed in the cavity;
- a recessed circuitry unit in the cavity and on the contact pad, a chamber of the cavity formed by the recessed circuitry unit and the tapered side of the cavity, the recessed circuitry unit having a non-horizontal side and the cavity includes a chamber of the cavity formed by the non-horizontal side and the tapered side of the cavity;
- a thermal structure over the recessed circuitry unit, the cavity, and the encapsulation; and
- a thermal adhesive applied to the thermal structure, the encapsulation, and the recessed circuitry unit, the thermal structure separated from the encapsulation and the recessed circuitry unit by the thermal adhesive.

7. The system as claimed in claim 6 further comprising an underfill applied around the contact pad between the recessed circuitry unit and the package stack assembly.

8. The system as claimed in claim 6 wherein the thermal adhesive is in the chamber.

9. The system as claimed in claim 6 further comprising an underfill around the contact pad.

10. The system as claimed in claim 6 wherein the thermal adhesive includes the thermal adhesive attached to the thermal structure, the recessed circuitry unit, and interior of the cavity.

* * * * *